United States Patent
Meng et al.

(10) Patent No.: US 12,105,044 B1
(45) Date of Patent: Oct. 1, 2024

(54) QUALITY DETECTION METHOD FOR MICROELECTROSTATIC DEVICE WITH BUILT-IN POWER SUPPLY

(71) Applicant: AirQuality Technology (Shanghai) Co., Ltd., Shanghai (CN)

(72) Inventors: Shanqing Meng, Shanghai (CN); Shidan Long, Shanghai (CN); Kejun Jiang, Shanghai (CN)

(*) Notice: Subject to any disclaimer, the term of this patent is extended or adjusted under 35 U.S.C. 154(b) by 0 days.

(21) Appl. No.: 18/587,775

(22) Filed: Feb. 26, 2024

Related U.S. Application Data (63) Continuation of application No. PCT/CN2023/095989, filed on May 24, 2023.

(30) Foreign Application Priority Data

Mar. 16, 2023 (CN) .................. 202310258505.7

(51) Int. Cl.
G01N 27/20 (2006.01)
G01R 19/00 (2006.01)
G01R 29/12 (2006.01)

(52) U.S. Cl.
CPC ......... G01N 27/20 (2013.01); G01R 19/0092 (2013.01); G01R 29/12 (2013.01)

(58) Field of Classification Search
CPC ..... G01N 27/20; G01R 19/0092; G01R 29/12
See application file for complete search history.

(56) References Cited

U.S. PATENT DOCUMENTS

2006/0251550 A1* 11/2006 Keras ............... B01D 53/32 422/186.04
2019/0204373 A1* 7/2019 Tung ............... H05K 1/0215

FOREIGN PATENT DOCUMENTS

| CN | 203103585 U | 7/2013 | |
|----|----|----|----|
| CN | 105371471 A | 3/2016 | |
| CN | 205280901 U | 6/2016 | |
| CN | 205949063 U | 2/2017 | |
| CN | 106546862 A | * 3/2017 | |
| CN | 108427042 A | 8/2018 | |
| CN | 112114203 A | 12/2020 | |
| CN | 112657678 A | * 4/2021 | |
| CN | 112844845 A | * 5/2021 | ............... B03C 3/09 |
| CN | 215866475 U | 2/2022 | |
| CN | 115656563 A | 1/2023 | |
| JP | H0370366 U | 7/1991 | |

(Continued)

OTHER PUBLICATIONS

English translation of JP 2006272127 A (Year: 2006).*
English translation of CN 106546862 A (Year: 2017).*
English translation of CN 112657678 A (Year: 2021).*

(Continued)

*Primary Examiner* — Alexander Satanovsky
*Assistant Examiner* — Haidong Zhang (57) ABSTRACT

The present application provides a quality detection method for a microelectrostatic device with a built-in power supply, belonging to the field of air purification technology, the method includes electrically connecting an external power supply to the built-in power supply of the microelectrostatic device to form a live circuit; connecting a detection element in series with an ammeter, wherein the detection element is in contact with a surface of the microelectrostatic device and moves along the surface of the microelectrostatic device; detecting a reading of the ammeter in real-time, wherein dielectric material is not broken when the reading of the ammeter is zero.

8 Claims, 5 Drawing Sheets electrically connecting an external power supply to the built-in power supply of the microelectrostatic device to form a live circuit — S100 connecting a detection element in series with an ammeter, wherein the detection element is in contact with a surface of the microelectrostatic device and moves along the surface of the microelectrostatic device; detecting a reading of the ammeter in real-time, wherein dielectric material is not broken when the reading of the ammeter is zero, and the dielectric material is broken when the reading of the ammeter is not zero — S300

(56) References Cited

FOREIGN PATENT DOCUMENTS

JP        2006272127 A   * 10/2006
JP        2014234613 A     12/2014

OTHER PUBLICATIONS

English translation of CN 112844845 A (Year: 2021).*
Internation Search Report of PCT/CN2023/095989, Mailed Nov. 29, 2023.

* cited by examiner

QUALITY DETECTION METHOD FOR MICROELECTROSTATIC DEVICE WITH BUILT-IN POWER SUPPLY

CROSS-REFERENCE TO RELATED APPLICATIONS

This application claims priority to Chinese Patent Application No. 202310258505.7, titled "Quality Detection Method for Microelectrostatic Device with Built-in Power Supply", filed Mar. 16, 2023, the entire disclosure of which is incorporated herein by reference.

TECHNICAL FIELD

The present application belongs to the field of air purification technology, and specifically relates to a quality detection method for a microelectrostatic device with a built-in power supply.

BACK GROUND

The current microelectrostatic device on the market uses dielectric material as the carrier of a strong electric field for air purification, the principle of which is that the dielectric material wraps the electrode sheet to form a honeycomb hollow microporous channel, a strong electric field is formed within the channel, and the particulate matter in the air is attracted by the electric field after it is charged and adsorbed within the honeycomb hollow microporous channel, so that microorganisms adhering to the particulate matter are collected together and killed in a strong electric field, for example, the application Np. CN202211260929.9 provides a microelectrostatic purification device for resisting high humidity.

The microelectrostatic device has high requirements for the production process, if the production process is improper, or the workers are not operating properly, it is easy to produce defective products. The problematic microelectrostatic device is mainly manifested that the dielectric material is incompletely wrapped and broken, has rolled edges, and electrode sheets are exposed. The damage of the dielectric material is divided into visible damage and non-visible damage, the visible damage is recognized by the detection workers, but the non-visible damage is difficult to be detected by the detection workers. Microelectrostatic devices with broken dielectric material are subject to low dust holding capacity, low purification efficiency, short maintenance intervals and safety problems during use, such as increased risk of ignition and short-circuiting, even leading to localised arcing and melting at elevated temperatures. In addition, when the electrode strip and the conductive material are not reliably connected, or partially unconnected, it is equally difficult to identify by the naked eye.

At current stage, there are no effective detection methods available on the market that can recognize breaks in the dielectric material not visible to the naked eye, and that can check the reliability of the internal electrical connections.

SUMMARY

In view of the various shortcomings of the related art and in order to solve the above problems, a quality detection method for a microelectrostatic device with a built-in power supply is proposed.

In order to achieve the above purpose, the present application provides the following technical solutions:

In a first aspect, the present application provides a quality detection method for a microelectrostatic device with a built-in power supply, including:

S100, electrically connecting an external power supply to the built-in power supply of the microelectrostatic device to form a live circuit;

S300, connecting a detection element in series with an ammeter, wherein the detection element is in contact with a surface of the microelectrostatic device and moves along the surface of the microelectrostatic device; detecting a reading of the ammeter in real-time, wherein dielectric material is not broken when the reading of the ammeter is zero, and the dielectric material is broken when the reading of the ammeter is not zero;

wherein the microelectrostatic device is located in a detection workpiece, the detection workpiece comprises a side plate, a bottom plate and a conductive connection member, the side plate is provided with mounting holes for mounting the conductive connection member, and positions where the mounting holes are connected to the conductive connection member are insulated;

the bottom plate is provided with a first conductive layer, the first conductive layer is connected in series with the ammeter, when the reading of the ammeter is not zero, an spark phenomenon occurs where the detection element is attached to the microelectrostatic device; or the dielectric material is broken when the spark phenomenon occurs where the bottom plate is attached to the microelectrostatic device; and the dielectric material is not broken when the reading of the ammeter is zero, and no spark phenomenon occurs where the bottom plate and the detection element are attached to the microelectrostatic device.

In an embodiment, the detection workpiece further includes a back plate, the back plate is provided with a second conductive layer, and the second conductive layer is attached to the first conductive layer.

In an embodiment, the bottom plate is provided with a first elongate hole along a width direction of the bottom plate, the back plate is provided with a second elongate hole corresponding to the first elongate hole, the first elongate hole and the second elongate hole are fastened by fastening bolts, and a relative position of the back plate to the bottom plate is adjustable by the fastening bolts.

In an embodiment, the dielectric material is broken when the reading of the ammeter is not zero, and the spark phenomenon occurs where the bottom plate is attached to the microelectrostatic device or the spark phenomenon occurs where the detection element is attached to the microelectrostatic device;

an electrode strip is not tightly wrapped when the reading of the ammeter is not zero, or the spark phenomenon occurs where the back plate is attached to the microelectrostatic device; and the microelectrostatic device is qualified when the reading of the ammeter is zero, and no spark phenomenon occurs where the bottom plate, the back plate and the detection element are attached to the microelectrostatic device respectively.

In an embodiment, in S300, electrically connecting one end of the detection element to an input end of the ammeter, grounding an output end of the ammeter, wherein another end of the detection element is in contact with an upper surface of the microelectrostatic device and moves along the surface of the microelectrostatic device, and the detection element is made of conductive material.

In an embodiment, the end of the detection element in contact with the upper surface of the microelectrostatic device is provided as a brush-like structure.

In a second aspect, the present application provides a quality detection method for a microelectrostatic device with a built-in power supply, including:

S100, electrically connecting an external power supply to the built-in power supply of the microelectrostatic device to form a live circuit;

S200, a test probe of an electrostatic field detector moving along a surface of the microelectrostatic device, wherein when an absolute value of a real-time induced voltage displayed by the electrostatic field detector is not less than a voltage threshold, a dust collection plate of the microelectrostatic device is connected normally to an electrode strip, and when the absolute value of the real-time induced voltage displayed by the electrostatic field detector is less than a voltage threshold, the dust collection plate of the microelectrostatic device is connected abnormally to the electrode strip; and S300, connecting the detection element in series with the ammeter, wherein the detection element is in contact with the surface of the microelectrostatic device and moves along the surface of the microelectrostatic device, detecting a reading of the ammeter in real-time, wherein dielectric material is not broken when the reading of the ammeter is zero, and the dielectric material is broken when the reading of the ammeter is not zero.

In an embodiment, in S200, a moving route of the test probe of the electrostatic field detector on the surface of the microelectrostatic device is an S-curve, and S200 and S300 are switchable.

In an embodiment, in S200, the voltage threshold is determined as follows:

charging the microelectrostatic device by the external power supply before the microelectrostatic device is encapsulated; and when the microelectrostatic device is in a fully charged state, measuring an induced voltage in the fully charged state by the electrostatic field detector, and using the induced voltage of 0.5-1 times as the voltage threshold of the electrostatic field detector.

The beneficial effects of the present application are:
1. Using the detection element to move along the surface of the microelectrostatic device, by observing the reading of the ammeter and whether the spark phenomenon occurs, the broken dielectric material not visible to the naked eye can be quickly identified, so as to avoid the defective products from flowing into the market.
2. Through the observation of whether the spark phenomenon occurs where the back plate is attached to the microelectrostatic device and the reading of the ammeter, to determine whether the electrode strip is exposed outside the microelectrostatic device, to avoid the phenomenon that the electrode strip is not strictly wrapped.
3. The test probe of the electrostatic field detector is used to move along the surface of the microelectrostatic device, through the observation of the reading of the electrostatic field detector, it can quickly identify whether the dust collection plate and the electrode strip are connected abnormally.
4. The position of the back plate is adjusted through cooperation of the first elongate hole, the second elongate hole and the fastening bolts to meet different specifications of the microelectrostatic device.
5. The second end of the thimble is set in the form of teeth or needles to improve its contact stability with the electrode contact sheet

Reference number: 1—external power supply, 2—built-in power supply, 3—detection workpiece, 4—side plate, 5—back plate, 6—bottom plate, 7—detection element, 8—first elongate hole, 9—mounting hole, 10—second elongate hole, 11—ammeter, 12—microelectrostatic device, 13—house body, 14—filter cartridge layer, 15—electrode contact sheet, 16—spring thimble, 17—housing, 18—spring, 19—thimble, 20—through-hole, 21—insulated handle, 22—brush structure.

DETAILED DESCRIPTION OF THE EMBODIMENTS

In order to enable those skilled in the art to better understand the technical solution of the present application, the following is a clear and complete description of the technical solution of the present application in conjunction with the accompanying drawings of the present application, and based on the embodiments in the present application, other similar embodiments obtained by those skilled in the art without making creative labour shall fall within the scope of the present application. In addition, the following embodiments are referred to with the words of direction, such as "up", "down", "left", "right", etc., which are only the directions of the reference drawings, and therefore, the terms of orientation are used to illustrate and not to limit the present application.

Embodiment I

Figure 1:
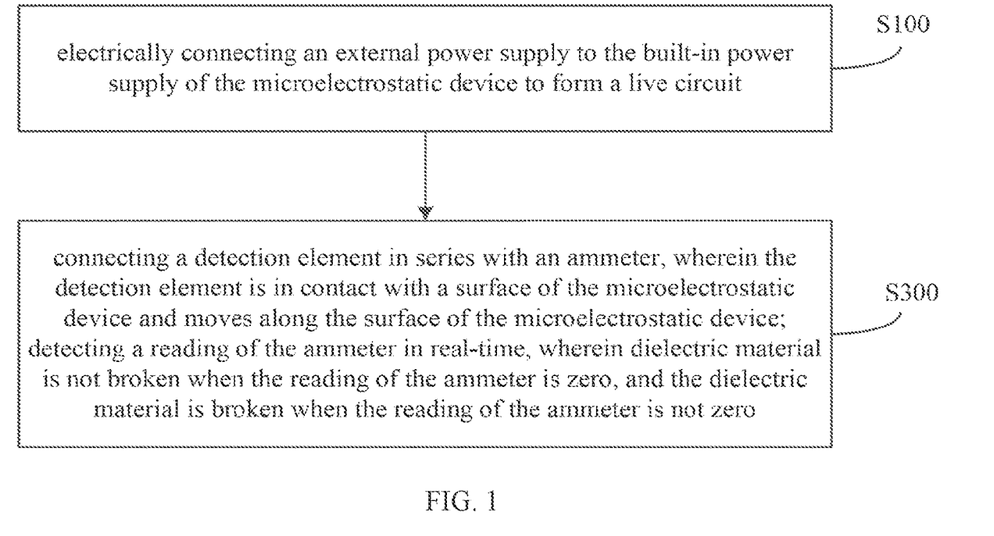
FIG. 1 is a flowchart of one embodiment of the present application.
Figure 2:
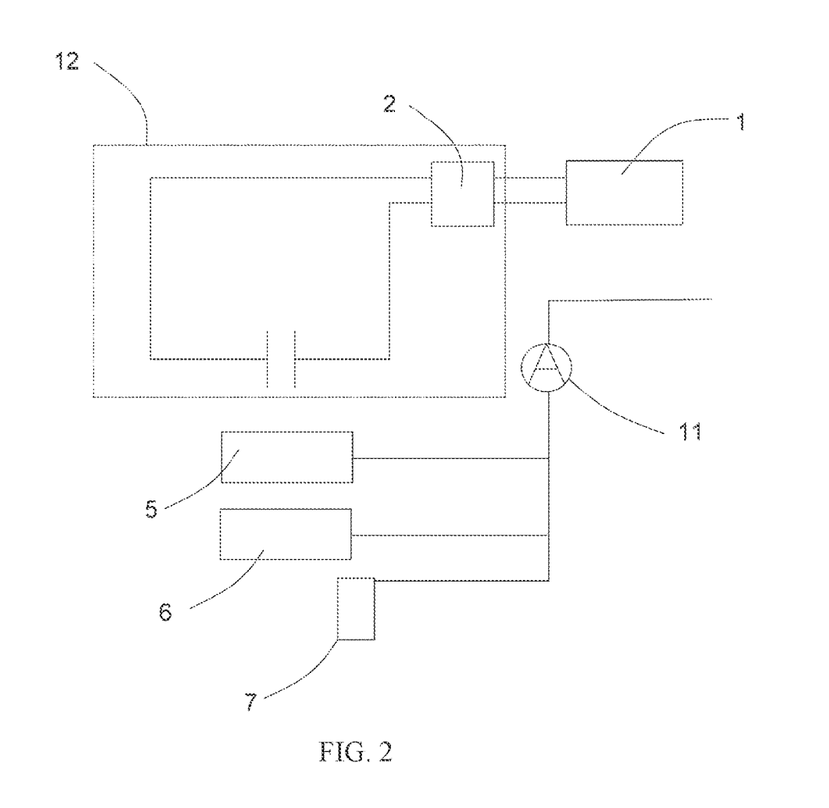
FIG. 2 is a schematic diagram of a circuit of the present application.

As shown in FIGS. 1 and 2, a quality detection method for a microelectrostatic device with a built-in power supply, including:

S100, electrically connecting an external power supply 1 to the built-in power supply 2 of the microelectrostatic device to form a live circuit.

Specifically, the specific structure of the microelectrostatic device with the built-in power supply please refers to paragraphs to of the specification in the application No. CN202211260929.9, which provides a microelectrostatic purification device for resisting high humidity. The ammeter 11 may be a microampere level ammeter or an alternative current (AC)/direct current (DC) microampere current gear of a multimeter.

The external power supply 1 is for supplying power and then converted by the built-in power supply 2 into DC high voltage, which can be negative or positive, and the microelectrostatic device forms an electric field to adsorb charged particles, sterilise and disinfect. In the DC circuit, the microelectrostatic device likes a capacitor, capable of storing an electric charge. After the external power supply 1 and the built-in power supply 2 form a live circuit, the external power supply 1 charges the microelectrostatic device, and at the beginning of charging, the current in the microelectrostatic device is generally tens of microamps, and as the charging time is increased, the charging current gradually decreases until the current in the microelectrostatic device drops to 0 microamps, at this time, the microelectrostatic module is in the fully charged state.

S300, connecting a detection element 7 in series with an ammeter 11, wherein the detection element 7 is in contact with a surface of the microelectrostatic device 12 and moves along the surface of the microelectrostatic device 12; detecting a reading of the ammeter 11 in real-time, wherein dielectric material is not broken when the reading of the ammeter 11 is zero, and the dielectric material is broken when the reading of the ammeter 11 is not zero.

Figure 10:
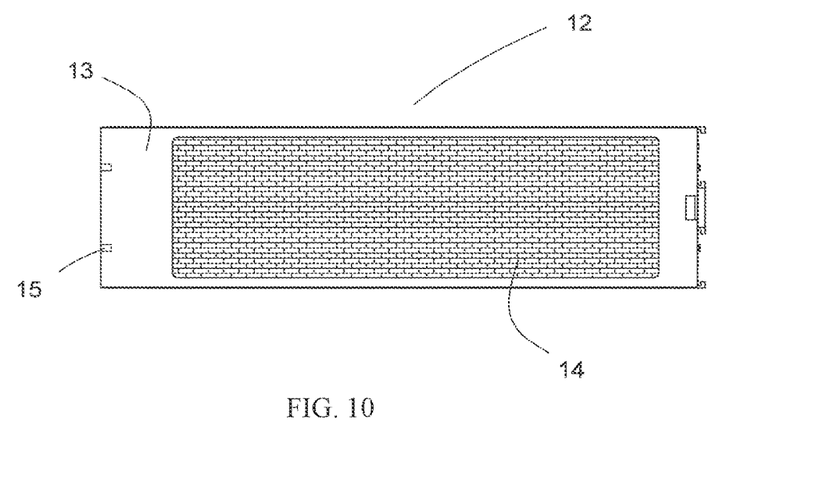
FIG. 10 is a schematic structural diagram of a microelectrostatic device according to an embodiment of the present application.

As shown in FIG. 10, the microelectrostatic device 12 includes a housing body 13, a built-in power supply 2, and a filter cartridge layer 14, The built-in power supply 2 and the filter cartridge layer 14 are located inside the housing body 13. Meanwhile, the housing body 13 is provided with an electrode contact sheet 15, the electrode contact sheet 15 is connected to the built-in power supply 2, the built-in power supply 2 is electrically connected to an electrode strip, and the electrode strip is provided at an end of the filter cartridge layer 14. Specifically, the detection element 7 is in contact with the surface of the filter cartridge layer 14 and moves along the surface of the filter cartridge layer 14.

As shown in FIGS. 1, 3, 5, and 11, in S100, the external power supply 1 is connected to the electrode contact sheet 15 via a conductive connection member to achieve that the external power supply 1 is electrically connected to the built-in power supply 2 of the microelectrostatic device to form a live circuit.

Figure 3:
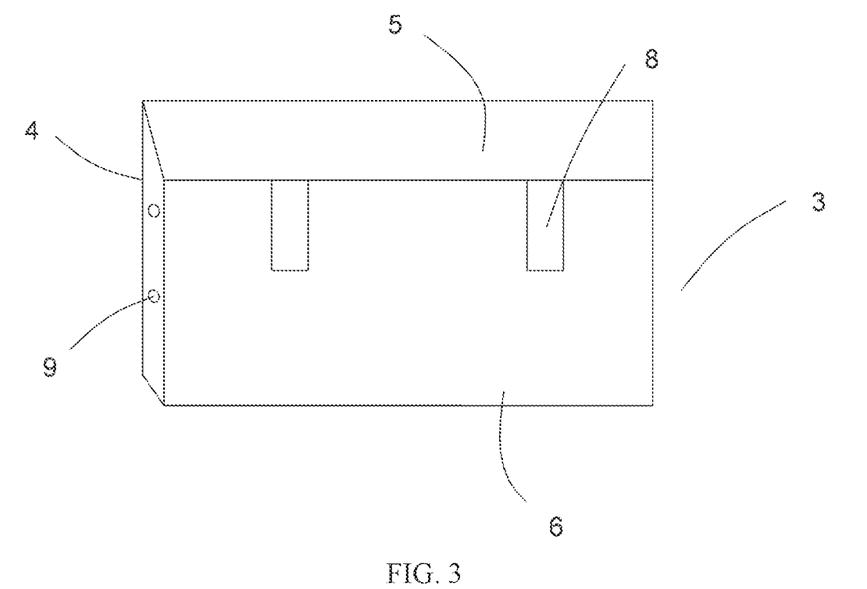
FIG. 3 is a schematic structural diagram of a detection workpiece of the present application.

The microelectrostatic device 12 is provided on a detection workpiece 3, and the microelectrostatic device 12 is pushed along the surface of the detection workpiece 3 to make the conductive connection member to connect with the electrode contact sheet 15. At the same time, the detection workpiece 3 is grounded.

The detection workpiece 3 includes a side plate 4, the side plate 4 is provided with mounting holes 9 for mounting the conductive connection member, positions where the mounting holes 9 are connected to the conductive connection member are insulated.

Specifically, the side plate 4 may be made of insulating material. Alternatively, the side plate 4 is made of conductive material and only positions where the mounting holes 9 are are connected to the conductive connection member are insulated.

There are a plurality of the mounting holes 9 to match the spacing of the electrode contact sheets 15. When the electrode contact sheets 15 are located on the same side of the microelectrostatic device 12, the mounting holes 9 corresponding to the electrode contact sheets 15 are selected to mount the conductive connection members. When the electrode contact sheets 15 are located on different sides of the microelectrostatic device 12, the electrode contact sheets 15 on one side of the microelectrostatic device 12 are connected to the conductive connection members on the side plate 4, and the electrode contact sheets 15 on the other side of the microelectrostatic device 12 may be connected to the external power supply 1 through other conductive elements. Alternatively, the detection workpiece 3 is provided with two side plates 4 opposite to each other, and the electrode contact sheets 15 on both sides of the microelectrostatic device 12 are connected to the conductive connection members on the corresponding side plates 4.

The detection workpiece 3 further includes a bottom plate 6, the bottom plate 6 is attached to a lower surface of the microelectrostatic device 12, i.e. the microelectrostatic device 12 is located on the bottom plate 6. The bottom plate 6 is provided with a first conductive layer, the first conductive layer is connected in series with the ammeter 11.

Specifically, the bottom plate 6 may be made of the conductive material. Alternatively, the bottom plate 6 is made of the insulating material, and only the first conductive layer is provided where the bottom plate 6 is attached to the side of the microelectrostatic device 12.

Specifically, when the reading of the ammeter 11 is not zero, the spark phenomenon occurs where the detection element 7 is attached to the microelectrostatic device 12, or the spark phenomenon occurs where the bottom plate 6 is attached to the microelectrostatic device 12, it indicates that the dielectric material is broken, and when the reading of the ammeter is zero, and the spark phenomenon does not occur where the bottom plate 6 and the detection element 7 are attached to the microelectrostatic device 12, it indicates that the dielectric material is not broken.

The detection workpiece 3 further includes a back plate 5, the back plate 5 is attached to a side of the microelectrostatic device 12, the back plate 5 is provided with a second conductive layer, and the second conductive layer is attached to the first conductive layer.

Specifically, the back plate 5 may be made of the conductive material. Or, the back plate 5 is made of the insulating material, and only the second conductive layer is provided where the back plate 5 is attached to the side of the microelectrostatic device 12.

Specifically, the reading of the ammeter 11 is not zero, and the spark phenomenon occurs where the bottom plate 6 is attached to the microelectrostatic device 12, or the spark phenomenon occurs where the detection element 7 is attached to the microelectrostatic device 12, it means that the dielectric material is broken; when the reading of the ammeter 11 is not zero, or the spark phenomenon occurs where the back plate 5 is attached to the microelectrostatic device 12, it means that the electrode strips are not wrapped tightly; when the reading of the ammeter 11 is zero, and no spark phenomenon occurs where the bottom plate 6, the back plate 5, and the detection element 7 are attached to the microelectrostatic device 12, it means that the microelectrostatic device is a qualified.

Figure 4:
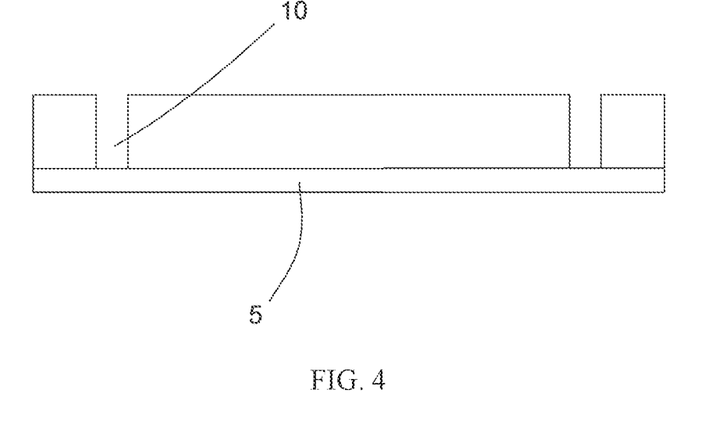
FIG. 4 is a top view of a back plate of the present application.

The bottom plate 6 is provided with a first elongate hole 8 along its width direction, and the back plate 5 is provided with a second elongate hole 10 corresponding to the first elongate hole 8, and the first elongate hole 8 and the second elongate hole 10 are fastened by fastening bolts.

As shown in FIG. 4, the back plate 5 is of an L-shaped structure, one edge of the back plate 5 is attached to the side of the microelectrostatic device 12, and the other edge of the back plate 5 is attached to the bottom plate 6. The position of the back plate 5 is adjusted to meet different specifications of the microelectrostatic device 12 through the cooperation of the first elongated hole 8, the second elongated hole 10 and the fastening bolt.

Figure 5:
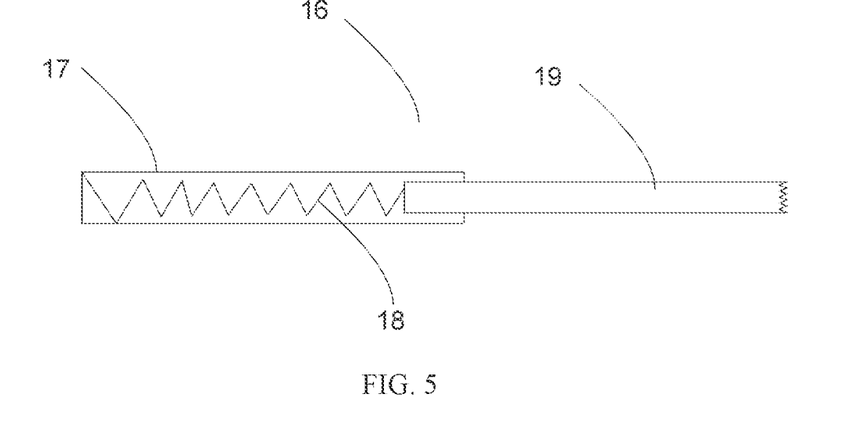
FIG. 5 is a schematic structural diagram of a spring-loaded thimble according to an embodiment of the present application.

The conductive connection member is a spring thimble 16, the spring thimble 16 includes a housing 17, a spring 18, and a thimble 19, the housing 17 has a cavity inside, the spring 18 is provided in the cavity, a first end of the thimble 19 is extended into the inside of the cavity and connected to the spring 18, and the second end of the thimble 19 is provided outside the cavity.

Figure 6:
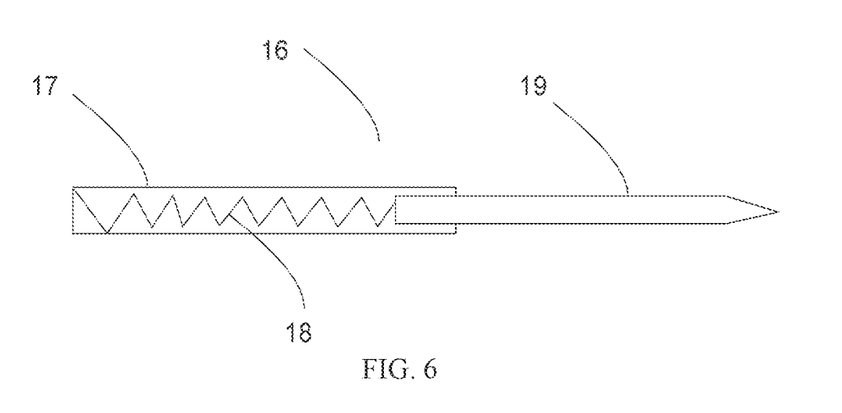
FIG. 6 is a schematic structural diagram of the spring-loaded thimble according to another embodiment of the present application.

Specifically, the housing 17 is provided inside the mounting hole 9 and fixed, the first end of the thimble 19 is connected to the external power supply 1, the second end of the thimble 19 is connected to the electrode contact sheet 15, and the second end of the thimble 19 is shaped as a tooth to improve the stability of its contact with the electrode contact sheet 15. In some other embodiments, the second end of the thimble 19 may also be shaped as a needle, as shown in FIG. 6.

Figure 7:
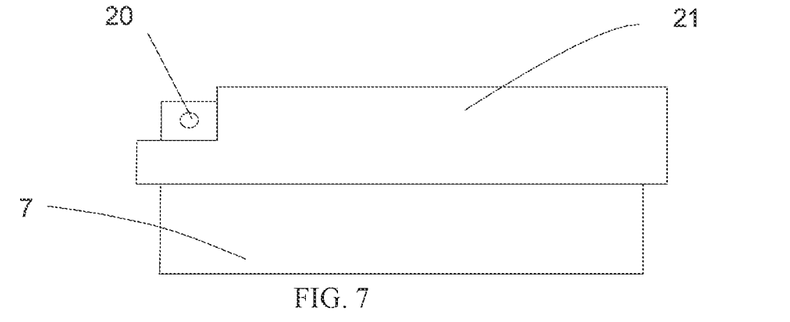
FIG. 7 is a schematic structural diagram of a detection element according to an embodiment of the present application.

As shown in FIGS. 1 and 7, in S300, the detection element 7 is made of the conductive material, one end of the detection element 7 is electrically connected to an input end of the ammeter 11, an output end of the ammeter 11 is grounded, and another end of the detection element 7 is connected with an upper surface of the microelectrostatic device 12 and moves along the surface of the microelectrostatic device 12.

In S300, when the reading of the ammeter 11 is not zero or the spark phenomenon occurs where the detection element 7 is in contact with the microelectrostatic device 12, it indicates that the dielectric material is broken.

When the detection element 7 is moving, when the detection element 7 is in contact with a broken position of the dielectric material, the charge accumulated on the microelectrostatic device 12 is quickly released, at this time, the external power supply 1 will continue to charge the microelectrostatic device 12, and the reading of the ammeter 11 is not zero correspondingly, and at the same time, the spark phenomenon occurs at the detection element 7 with an acoustic sound.

The length of the detection element 7 is the same as the width of the filter cartridge layer 14, in order to improve the detection accuracy.

Figure 8:
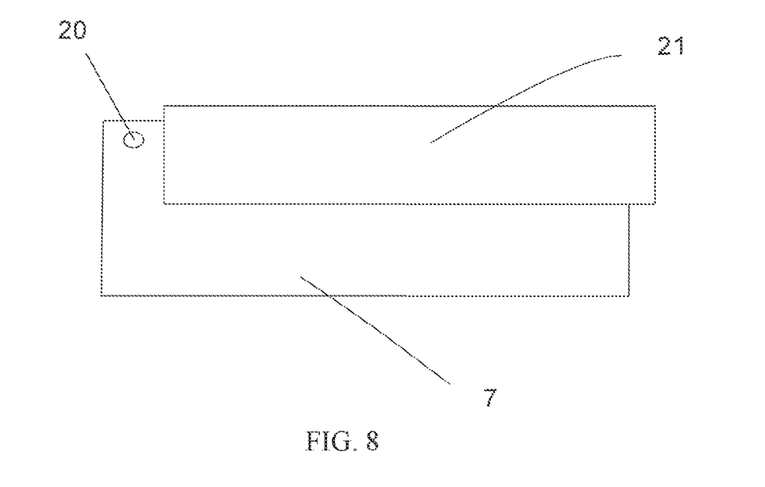
FIG. 8 is a schematic structural diagram of the detection element according to another embodiment of the present application.

The detection element 7 is provided with a through-hole 20 and an insulating handle 21, the through-hole 20 is electrically connected to an input end of the ammeter 11 by a wire, and the insulating handle 21 is easy to hold. Specifically, the insulating handle 21 completely wraps around the top of the detection element 7, while the insulating handle 21 is provided with an avoidance groove to set the through-hole 20. In some other embodiments, as shown in FIG. 8, the insulating handle 21 is not completely wrapped around the top of the detection element 7 to facilitate the setting of the through-hole 20.

Figure 9:
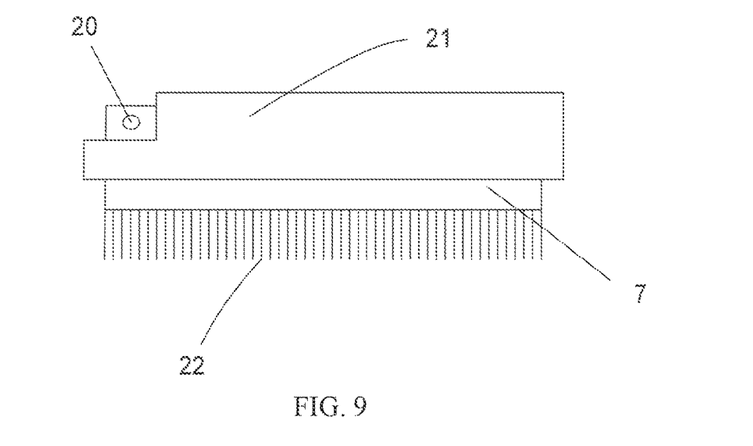
FIG. 9 is a schematic structural diagram of the detection element according to another embodiment of the present application.

As shown in FIG. 9, one end of the detection element 7 in contact with the upper surface of the microelectrostatic device 12 is provided as a brush-like structure 22 to improve the stability of the detection element 7 in contact with the upper surface of the microelectrostatic device 12.

Embodiment II

Figure 11:
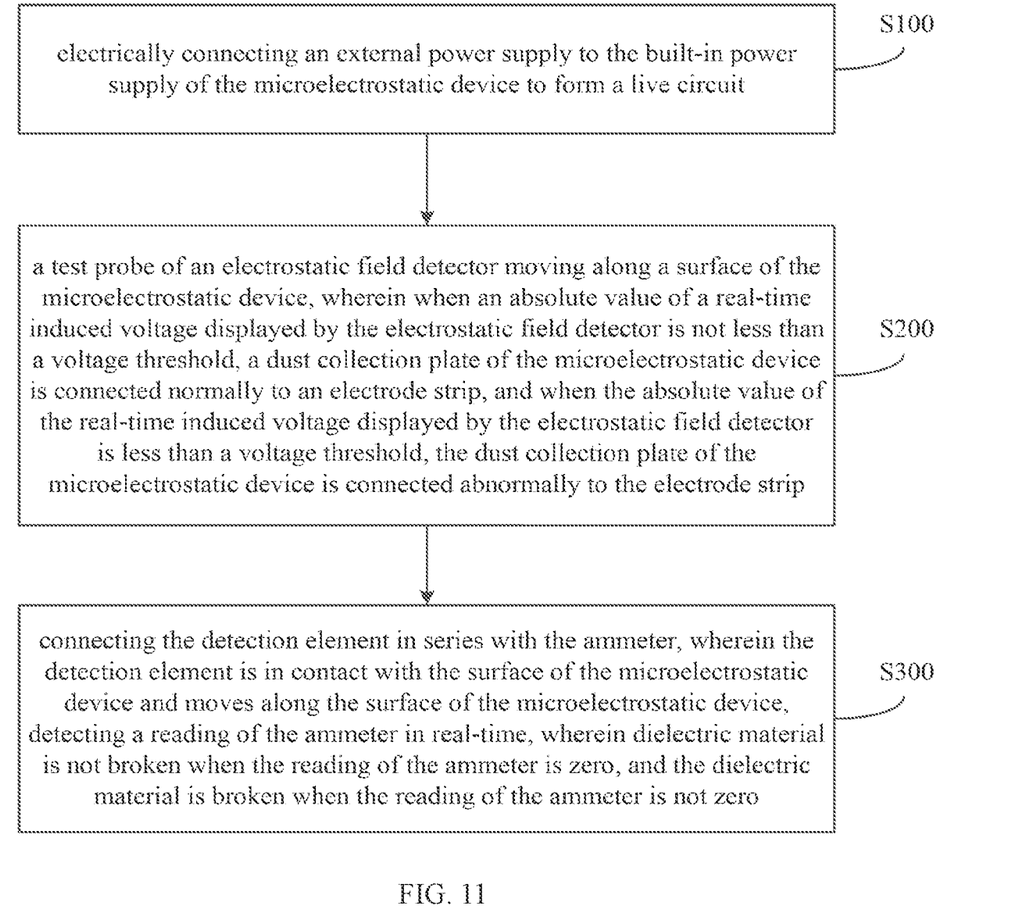
FIG. 11 is a flowchart of another embodiment of the present application.

As shown in FIG. 11, the parts of this embodiment that are the same as embodiment I will not be repeated, and the differences therebetween are that:

A quality detection method for a microelectrostatic device with a built-in power supply, including:

S100, electrically connecting an external power supply to the built-in power supply of the microelectrostatic device to form a live circuit;

S200, a test probe of an electrostatic field detector moving along a surface of the microelectrostatic device, wherein when an absolute value of a real-time induced voltage displayed by the electrostatic field detector is not less than a voltage threshold, a dust collection plate of the microelectrostatic device is connected normally to an electrode strip, and when the absolute value of the real-time induced voltage displayed by the electrostatic field detector is less than a voltage threshold, the dust collection plate of the microelectrostatic device is connected abnormally to the electrode strip; and S300, connecting the detection element in series with the ammeter, wherein the detection element is in contact with the surface of the microelectrostatic device and moves along the surface of the microelectrostatic device, detecting a reading of the ammeter in real-time, wherein dielectric material is not broken when the reading of the ammeter is zero, and the dielectric material is broken when the reading of the ammeter is not zero.

In S200, a moving route of the test probe of the electrostatic field detector on the surface of the microelectrostatic device is an S-curve, so as to avoid missing the detection point and improve the detection accuracy. Due to the unique structure of the microelectrostatic module, the detection along the S-curve can include all energisation cases. Meanwhile, S200 and S300 are switchable.

In S200, the voltage threshold is determined as follows:

charging the microelectrostatic device by the external power supply before the microelectrostatic device is encapsulated; and when the microelectrostatic device is in a fully charged state, measuring an induced voltage in the fully charged state by the electrostatic field detector, and using the induced voltage of 0.5-1 times as the voltage threshold of the electrostatic field detector, preferably 0.8 times, which is for the purpose of quickly determining the quality of the microelectrostatic device during the production process, at this time the microelectrostatic device is substantially close to a fully charged state, other multiples can also be selected for the detection judgement.

The above is a detailed description of the present application, the above is only preferable embodiment of the present application, when the present application can not be limited to the scope of the present application, that is, all changes and modifications made in accordance with the scope of the present application shall fall within the scope of the present application.

The invention claimed is:

1. A quality detection method for a microelectrostatic device with a built-in power supply, comprising:
   electrically connecting an external power supply to the built-in power supply of the microelectrostatic device to form a live circuit;
   connecting a detection element in series with an ammeter, wherein the detection element is in contact with a surface of the microelectrostatic device and moves along the surface of the microelectrostatic device;

detecting a reading of the ammeter in real-time, wherein dielectric material is not broken when the reading of the ammeter is zero, and the dielectric material is broken when the reading of the ammeter is not zero;

wherein the microelectrostatic device is located in a detection workpiece, the detection workpiece comprises a side plate, a bottom plate and a conductive connection member, the side plate is provided with mounting holes for mounting the conductive connection member, and positions where the mounting holes are connected to the conductive connection member are insulated;

the bottom plate is provided with a first conductive layer, the first conductive layer is connected in series with the ammeter, when the reading of the ammeter is not zero, a spark phenomenon occurs where the detection element is attached to the microelectrostatic device, or the dielectric material is broken when the spark phenomenon occurs where the bottom plate is attached to the microelectrostatic device; and the dielectric material is not broken when the reading of the ammeter is zero, and no spark phenomenon occurs where the bottom plate and the detection element are attached to the microelectrostatic device.

2. The quality detection method for the microelectrostatic device with the built-in power supply according to claim 1, wherein the detection workpiece further comprises a back plate, the back plate is provided with a second conductive layer, and the second conductive layer is attached to the first conductive layer.

3. The quality detection method for the microelectrostatic device with the built-in power supply according to claim 2, wherein the bottom plate is provided with a first elongate hole along a width direction of the bottom plate, the back plate is provided with a second elongate hole corresponding to the first elongate hole, the first elongate hole and the second elongate hole are fastened by fastening bolts, and a relative position of the back plate to the bottom plate is adjustable by the fastening bolts.

4. The quality detection method for the microelectrostatic device with the built-in power supply according to claim 2, wherein the dielectric material is broken when the reading of the ammeter is not zero, and the spark phenomenon occurs where the bottom plate is attached to the microelectrostatic device or the spark phenomenon occurs where the detection element is attached to the microelectrostatic device;

an electrode strip is not tightly wrapped when the reading of the ammeter is not zero, or the spark phenomenon occurs where the back plate is attached to the microelectrostatic device; and the microelectrostatic device is qualified when the reading of the ammeter is zero, and no spark phenomenon occurs where the bottom plate, the back plate and the detection element are attached to the microelectrostatic device respectively.

5. The quality detection method for microelectrostatic device with the built-in power supply according to claim 1, wherein electrically connecting one end of the detection element to an input end of the ammeter, grounding an output end of the ammeter, wherein another end of the detection element is in contact with an upper surface of the microelectrostatic device and moves along the surface of the microelectrostatic device, and the detection element is made of conductive material.

6. The quality detection method for the microelectrostatic device with the built-in power supply according to claim 5, wherein the end of the detection element in contact with the upper surface of the microelectrostatic device is provided as a brush-like structure.

7. A quality detection method for a microelectrostatic device with a built-in power supply, comprising:

electrically connecting an external power supply to the built-in power supply of the microelectrostatic device to form a live circuit;

moving a test probe of an electrostatic field detector along a surface of the microelectrostatic device, wherein when an absolute value of a real-time induced voltage displayed by the electrostatic field detector is not less than a voltage threshold, a dust collection plate of the microelectrostatic device is connected normally to an electrode strip, and when the absolute value of the real-time induced voltage displayed by the electrostatic field detector is less than a voltage threshold, the dust collection plate of the microelectrostatic device is connected abnormally to the electrode strip; and connecting the detection element in series with the ammeter, wherein the detection element is in contact with the surface of the microelectrostatic device and moves along the surface of the microelectrostatic device, detecting a reading of the ammeter in real-time, wherein dielectric material is not broken when the reading of the ammeter is zero, and the dielectric material is broken when the reading of the ammeter is not zero.

8. The quality detection method for the microelectrostatic device with the built-in power supply according to claim 7, wherein the voltage threshold is determined as follows: charging the microelectrostatic device by the external power supply before the microelectrostatic device is encapsulated; and when the microelectrostatic device is in a fully charged state, measuring an induced voltage in the fully charged state by the electrostatic field detector, and using the induced voltage of 0.5-1 times as the voltage threshold of the electrostatic field detector.

* * * * *